US012713516B2

(12) United States Patent
Afsharian et al.

(10) Patent No.: US 12,713,516 B2
(45) Date of Patent: Aug. 18, 2026

(54) CIRCUIT ASSEMBLY INCLUDING GALLIUM NITRIDE DEVICES

(71) Applicant: Murata Manufacturing Co., Ltd., Nagaokakyo (JP)

(72) Inventors: Jahangir Afsharian, Markham (CA); Bing Gong, Markham (CA); Ning Zhu, Markham (CA); Anil Yaramasu, Markham (CA)

(73) Assignee: MURATA MANUFACTURING CO., LTD., Kyoto (JP)

(*) Notice: Subject to any disclaimer, the term of this patent is extended or adjusted under 35 U.S.C. 154(b) by 188 days.

(21) Appl. No.: 18/285,540

(22) PCT Filed: Apr. 8, 2022

(86) PCT No.: PCT/US2022/024032
§ 371 (c)(1),
(2) Date: Oct. 4, 2023

(87) PCT Pub. No.: WO2022/217056
PCT Pub. Date: Oct. 13, 2022

(65) Prior Publication Data

US 2025/0081328 A1 Mar. 6, 2025

Related U.S. Application Data

(60) Provisional application No. 63/173,014, filed on Apr. 9, 2021.

(51) Int. Cl.
*H05K 1/02* (2006.01)

(52) U.S. Cl.
CPC ......... *H05K 1/0209* (2013.01); *H05K 1/0206* (2013.01)

(58) Field of Classification Search
CPC ..... H05K 1/0201–0212; H05K 1/0271; H05K 1/111; H05K 1/115; H05K 1/181; H05K 7/1432; H05K 7/14329; H05K 7/1472; H05K 7/1475; H05K 7/20; H05K 7/20172; H05K 7/2039; H05K 7/205;
(Continued)

(56) References Cited

U.S. PATENT DOCUMENTS 11,393,737 B2 * 7/2022 Shikama ................ H05K 7/205
11,631,636 B2 * 4/2023 Thimm .................. H01L 23/36
361/715

(Continued)

FOREIGN PATENT DOCUMENTS

CN 206005004 U 3/2017
CN 107027237 A 8/2017

(Continued)

OTHER PUBLICATIONS

JP-02164100-A English Translation (Year: 1990).*

(Continued)

*Primary Examiner* — Amir A Jalali
(74) *Attorney, Agent, or Firm* — Keating & Bennett, LLP

(57) ABSTRACT

A circuit assembly includes a first printed circuit board (PCB), a switching device located on a first side of the first PCB, a heatsink attached to a second side surface of the first PCB opposite to the first side, and an L-shaped metal plate attached to the heatsink and to the first PCB.

20 Claims, 13 Drawing Sheets

(58) Field of Classification Search
CPC .. H05K 7/20509; H05K 7/209; H05K 3/0061; H05K 5/0247; H05K 5/0069; H05K 2201/066; H05K 2201/10166; H05K 2201/10272; H02M 7/00; H02M 7/537; H02M 1/08; H01L 23/3675; H01L 25/18
See application file for complete search history.

(56) References Cited

U.S. PATENT DOCUMENTS

| | | | | |
|---|---|---|---|---|
| 12,184,046 | B2 * | 12/2024 | Yoshimura | H02B 1/48 |
| 2002/0008312 | A1 * | 1/2002 | Sasaki | H01L 25/072 257/692 |
| 2006/0039127 | A1 * | 2/2006 | West | H05K 1/144 257/691 |
| 2006/0044762 | A1 | 3/2006 | Kikuchi et al. | |
| 2009/0121342 | A1 * | 5/2009 | Minakawa | H05K 1/14 257/E23.101 |
| 2012/0170261 | A1 * | 7/2012 | Hu | F21V 19/003 362/217.14 |
| 2013/0009675 | A1 * | 1/2013 | Chiba | H03K 17/691 327/109 |
| 2014/0063747 | A1 * | 3/2014 | Sotome | H05K 7/209 361/720 |
| 2015/0223317 | A1 * | 8/2015 | Oi | H05K 1/0306 174/251 |
| 2019/0044452 | A1 * | 2/2019 | Arita | F21V 15/013 |
| 2019/0126972 | A1 * | 5/2019 | Okamura | H05K 5/0047 |
| 2019/0181770 | A1 * | 6/2019 | Martin | H05K 7/14329 |
| 2019/0287933 | A1 * | 9/2019 | Fujii | H01L 24/73 |
| 2020/0053900 | A1 * | 2/2020 | Feurtado | H02M 7/537 |
| 2020/0068713 | A1 * | 2/2020 | Hayase | H05K 7/209 |
| 2020/0234905 | A1 * | 7/2020 | Shirakata | H01L 23/24 |
| 2020/0388550 | A1 * | 12/2020 | Wakaiki | H05K 1/0206 |
| 2021/0104970 | A1 * | 4/2021 | Suenaga | H05K 1/0203 |
| 2021/0195735 | A1 * | 6/2021 | Mok | H05K 3/0094 |
| 2021/0328482 | A1 * | 10/2021 | Rutowski | H05K 1/0271 |
| 2021/0385948 | A1 * | 12/2021 | Kong | H05K 1/115 |

FOREIGN PATENT DOCUMENTS

| | | | | | |
|---|---|---|---|---|---|
| DE | 102023105344 | B3 | * | 7/2024 | H10W 90/00 |
| JP | 02164100 | A | * | 6/1990 | |
| JP | 06-163768 | A | | 6/1994 | |
| JP | 2708830 | B2 | | 2/1998 | |
| JP | 2003-204184 | A | | 7/2003 | |
| JP | 2013012429 | A | * | 1/2013 | |
| JP | 2019-169638 | A | | 10/2019 | |

OTHER PUBLICATIONS

JP-2013012429-A English Translation (Year: 2013).*

DE-102023105344-B3 English Translation (Year: 2024).*

Official Communication issued in International Patent Application No. PCT/US2022/024032, mailed on Jul. 27, 2022.

Official Communication issued in corresponding Chinese Patent Application No. 202280026878.5, mailed on Mar. 25, 2026, 7 pages.

* cited by examiner

CIRCUIT ASSEMBLY INCLUDING GALLIUM NITRIDE DEVICES

CROSS REFERENCE TO RELATED APPLICATIONS

This application claims the benefit of U.S. Patent Application No. 63/173,014 filed on Apr. 9, 2021. The entire contents of this application are hereby incorporated by reference.

BACKGROUND OF THE INVENTION

1. Field of the Invention

The present invention relates to a circuit assembly including, for example, gallium nitride (GaN) devices for high-power-density power-supply applications.

2. Description of the Related Art

FIG. 1 is a circuit diagram of an AC-DC rectifier using a totem-pole power factor correction (PFC) topology. The main benefit of this totem-pole PFC topology compared to a classic boost PFC is that it is a bridgeless circuit, meaning that it does not include a rectifier diode bridge at its input. Therefore, the associated rectifier bridge losses are eliminated, leading to higher efficiency and power density. A benefit of using complementary enhancement-mode (e-mode) gallium nitride (GaN) semiconductors—with GaN being a wide-bandgap (WBG) material—is the complete elimination of any reverse recovery charge. Therefore, GaN devices work well with half-bridge, hard-switching circuitry in applications that cannot be addressed by conventional high-voltage superjunction power semiconductors. Under these conditions, the totem-pole PFC topology as shown in FIG. 1 is well suited to work with GaN devices.

FIG. 1 shows that GaN devices (within the dotted line box) are used as switches $S_1$ and $S_2$. A node MID between the switches $S_1$ and $S_2$ is connected to a terminal of an alternating current (AC) voltage source $V_{AC}$ through an inductor, and a node VD between the switches $S_{D1}$ and $S_{D2}$ is connected to another terminal of the AC voltage source $V_{AC}$. Each of a capacitor C and a resistor R is connected in parallel across the switches $S_{D1}$ and $S_{D2}$. Switches $S_1$ and $S_2$ are switched at a high switching frequency and provide the function of a boost switch and a rectifier switch, while switches $S_{D1}$ and $S_{D2}$ are switched at the line frequency and provide the function of a line rectifier. The totem pole circuitry can reach higher density limits at higher efficiency compared to a classic boost PFC circuit.

FIG. 2 shows another example of a higher-power, hard-switched topology as a circuit diagram of a conventional three-phase, six-switch boost converter using GaN devices. GaN devices $S_1$-$S_6$ can be used to increase efficiency and power density over comparable circuitry without GaN devices. Each of the series-connected switches $S_1$ and $S_2$, switches $S_3$ and $S_4$, and switches $S_5$ and $S_6$ are connected in parallel to a direct current (DC) voltage source $V_{DC}$, and a node between each of the series-connected switches $S_1$ and $S_2$, switches $S_3$ and $S_4$, and switches $S_5$ and $S_6$ is connected to an inductor $L_f$.

Increasing the power density of power supplies operating at higher switching frequencies is desirable. FIG. 3 shows a half-bridge LLC converter circuit with GaN devices $S_1$ and $S_2$ (within the dotted line box) in a soft-switching topology that operates at much higher switching frequencies than Si-MOSFET devices. The half-bridge LLC converter includes a transformer that provides an isolation barrier that divides the circuit in a primary-side circuit connected to the primary winding of the transformer (on the left side of FIG. 3) and a secondary-side circuit connected to the secondary winding of the transformer (on the left side of FIG. 3). The primary-side circuit includes a switching circuit including series-connected GaN devices $S_1$ and $S_2$ that are connected in parallel with the DC voltage source $V_{DC}$ and a resonant circuit that is connected between the switching circuit and the primary windings and that includes a resonant capacitor $C_r$, resonant inductor $L_r$, and magnetizing inductor $L_m$. The secondary-side circuit includes a rectifier circuit including switches $Q_3$ and $Q_4$. Using Si-MOSFET devices operating at a switching frequency above 350 kHz will increase the conduction losses due to the deadtime requirement of Si-MOSFET devices. A GaN device has a much smaller turn-off loss and required deadtime compared to Si-MOSFET devices so that it is more suitable to operate at higher frequencies. GaN devices can also be used in a full-bridge LLC converter configuration (not shown).

Due to its fast switching, a surface mounted package with low parasitic inductance is normally employed for GaN devices to reduce voltage spikes and ensure reliable operation. FIG. 4 shows a conventional GaN assembly with a GaN device shown as the top box and including a case 200 and device junction 201. The conventional structure with GaN devices on a laminated printed circuit board (PCB) 202 attached to a heatsink 203 can be used but suffers from the following drawbacks.

First, a large heatsink 203 is required. As shown in FIG. 4, the total thermal resistance from the device junction $T_j$ to ambient temperature $T_{amb}$ can be calculated as: $T_j$=Rth_jc+Rth_PCB+Rth_TIM+Rth_hsa, where Rth_jc is the thermal resistance of the device junction 201 to the case 200, Rth_PCB is the thermal resistance of the PCB 202, Rth_TIM is the thermal resistance of the thermal interface material (TIM) 204, and Rth_hsa is the thermal resistance of the heatsink 203 to the ambient temperature $T_{amb}$.

The thermal resistance of the PCB Rth_PCB is the dominant thermal resistor because of the low thermal conductivity of FR4, which is the most used PCB material. The heat generated by the GaN devices will create hot spots on the PCB 202 due to the concentrated surface area of the GaN devices. The high temperature of the GaN devices will in turn increase their drain-source on resistance (Rds_on). Therefore, the maximum power that can be delivered by the overall assembly is normally limited by the GaN device's maximum junction temperature, even when the current is well below the GaN device's rated current. To maximize the output power of the GaN devices, the heatsink temperature needs to be reduced to well below the case temperature of the GaN devices due to the large thermal resistance of the PCB 202. The effectiveness of the heatsink 203 can be significantly reduced when the heatsink temperature is low. In that case, the temperature difference between the heatsink 203 and ambient surrounding is small. Therefore, a large heatsink 203 is required, but the large heatsink 203 increases the power density and the overall cost of the circuit assembly.

Additionally, there are high losses at high current in conventional assemblies. Because a conventional PCB has limited copper for conducting current, the conduction loss at high current is large and increases the thermal stress of the assembly.

To address these problems in conventional assemblies that include GaN devices, a large heatsink has been used to increase cooling and/or a complicated bus bar has been used on the PCB to provide higher current. Additionally, the output power of conventional assemblies has been reduced to meet the temperature and rated-current specifications of the GaN devices. Additionally, thermal vias have been incorporated into the PCB to reduce the thermal resistance of the PCB.

Optionally, to address the problems of a conventional GaN assembly, an insulated metal substrate (IMS) 301 has been used to transfer heat as shown in FIGS. 5 and 6. FIGS. 5 and 6 are views of a horizontal IMS evaluation gate driver board, part number GSP665x-EVBIMS2 made by GaN Systems Co. An IMS 301 in FIG. 6, also called a metal core PCB, is made of a metal plate, thermal insulating layers, and a copper foil, which has special magnetic conductivity, excellent heat dissipation, high mechanical strength, and good processing performance. The IMS technology is very efficient for higher power applications featuring high power losses at limited layout density such as power-LED modules. However, using an IMS 301 limits layout density because it has only one or two layers for trace routing. Therefore, except the GaN devices, all the other circuitry including the gate driver circuit, isolated power supply, and input connectors are located on a standard PCB 302. The PCB 302 is attached to the IMS 301 through connectors. However, there is a large gap between the IMS 301 and PCB 302 because of the connectors. As shown in FIG. 6, this large gap will create a large power loop inductance path 303 that includes the DC decoupling capacitors 304, the IMS 301, and the PCB 302. The large power loop inductance path 303 can cause large drain-source voltage spikes and ringing of the GaN devices during transients because of fast switching of the GaN devices. Especially when the switching current is large, this ringing of the GaN devices can cause a high voltage difference over time (dv/dt) at the middle point of the half bridge, which can result in false turn-on of the switches. In addition, a high-spike voltage increases the voltage stress on the GaN devices and can result in the GaN devices exceeding their voltage rating. Therefore, these drawbacks make this conventional configuration not practical in power supply applications.

SUMMARY OF THE INVENTION

To overcome the problems described above, preferred embodiments of the present invention provide circuit assemblies each including high-power switching devices, such as GaN devices, on a PCB, a heatsink located on a first side of the PCB, and an L-shaped metal plate attached to the heatsink and to the PCB, which can significantly reduce the thermal resistance between the high-power switching devices and the ambient surroundings. Preferred embodiments of the present invention also provide circuit assemblies each including high-power switching devices, such as GaN devices, on a first PCB, a heatsink attached to the first PCB, and a second PCB with gate driver circuitry attached to the first PCB, which allows high-current routing of the first PCB to be improved or optimized.

Additionally, preferred embodiments of the present invention provide circuit assemblies each with double-sided cooling to improve the thermal performance of the circuitry of the circuit assembly. Additionally, copper-filled vias in the PCB underneath the high-power switching devices can significantly reduce the thermal resistance of the PCB.

An inlay PCB with high current and heat dissipation according to a preferred embodiment of the present invention can include:

1. A metal inlay, e.g., a copper inlay, that functions as a bus bar and a heatsink to significantly reduce conduction loss at high current.
2. A metal inlay with a large surface area compared to a PCB without a metal inlay that provides greater heat dissipation, especially when it is attached to another heatsink, due to the significantly reduced thermal resistance of the inlay PCB.
3. Combinability with an IMS that achieves very high power density and a much simplified manufacturing process of the GaN assembly by eliminating a separate heatsink.

A gate-driver PCB with an isolated power supply that is separate from the switching-device PCB according to a preferred embodiment of the present invention can provide several benefits, including:

1. Improved thermal cooling and current carrying capability of the switching-device PCB because the high-current routing on the switching-device PCB can be improved or optimized by separating the gate driver circuitry from high-current power routing.
2. An ability to use a transformer with a planar structure that is cost effective because the transformer with a planar structure can be integrated with the gate-driver PCB and more easily assembled.
3. An ability to use a winding arrangement of the transformer that can balance low inter-winding capacitance (low capacitance is important for reducing or minimizing common mode (CM) current injection due to fast-switching transients) with good coupling (low leakage inductance helps with open-loop output voltage regulation) and more than 1500 V isolation.
4. An ability to use a negative driver voltage that can be regulated to ensure that the gate threshold voltages of the devices are not exceeded during transients and to reduce or minimize reverse conduction losses.

According to a preferred embodiment of the present invention, a circuit assembly includes a first printed circuit board (PCB), a switching device located on a first side of the first PCB, a heatsink attached to a second side surface of the first PCB opposite to the first side, and an L-shaped metal plate attached to the heatsink and to the first PCB.

The L-shaped metal plate can contact a top surface of the switching device. The circuit assembly can further include thermal interface material (TIM) between the heatsink and the first PCB and between the L-shaped metal plate and the switching device. The L-shaped metal plate can include copper. The L-shaped metal plate can include a bend with an angle less than 90°. The first PCB can be about 1-mm thick.

The first PCB can include a middle metal plane as an interior layer. The middle metal plane can include multiple portions, and each of the multiple portions can be connected to a different circuit node on the first PCB. The middle metal plane of the first PCB can be connected to the switching device through microvias in the first PCB.

The first PCB can include copper-filled microvias located beneath the switching device. The first PCB can include a copper inlay, and the copper-filled vias can provide a thermal path between the switching device and the copper inlay.

The circuit assembly can further include a second PCB and driver circuitry on the second PCB that drives the switching device. A portion of the L-shaped plate can be located between the first PCB and the second PCB.

According to a preferred embodiment of the present invention, a circuit assembly includes a first printed circuit board (PCB), a switching device located on the first PCB, a heatsink attached to the first PCB, and a second PCB including gate driver circuitry attached to the first PCB.

The circuit assembly can further include a connector to route signals between the first PCB and the second PCB. The circuit assembly can further include an L-shaped metal plate, wherein a portion of the L-shaped metal plate can be located between the first PCB and the second PCB. A first leg of the L-shaped metal plate can be located between the first PCB and the second PCB, and a second leg of the L-shaped metal plate can be attached to the heatsink. The circuit assembly can further include a transformer integrated into the second PCB. The gate driver circuitry can be isolated. The switching device can be a gallium nitride switching device.

The above and other features, elements, steps, configurations, characteristics, and advantages of the present invention will become more apparent from the following detailed description of preferred embodiments of the present invention with reference to the attached drawings.

DETAILED DESCRIPTION OF PREFERRED EMBODIMENTS

Figure 1:
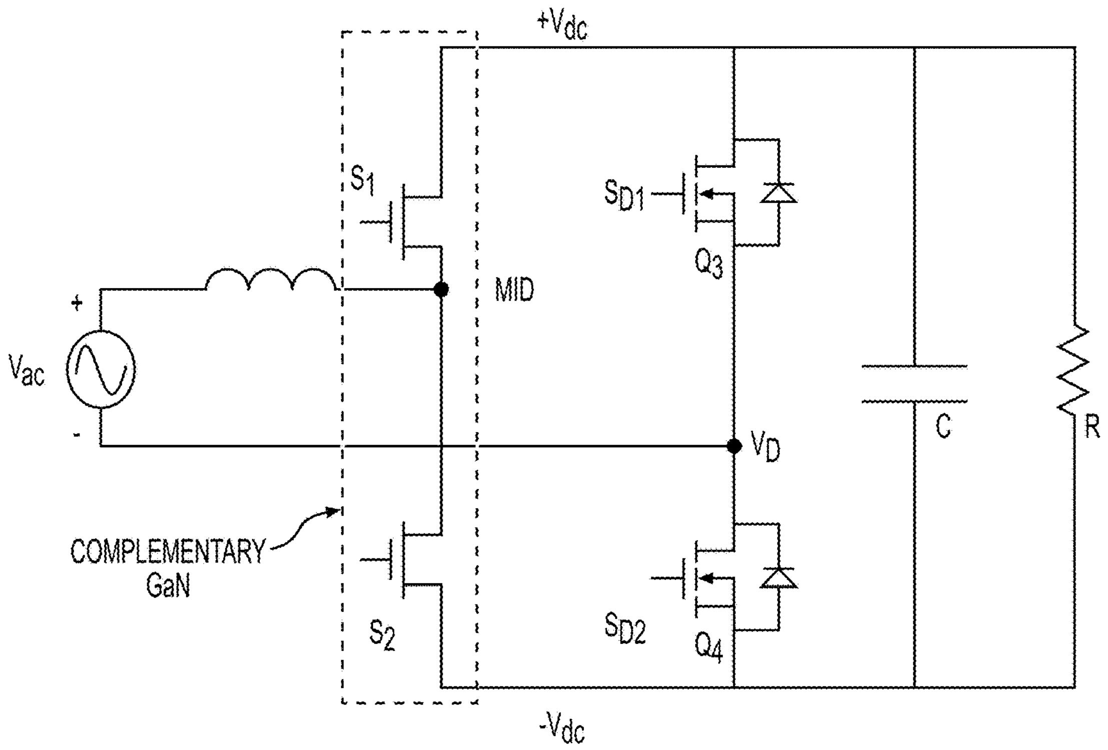
FIG. 1 is a circuit diagram of a conventional totem-pole bridgeless PFC circuit using GaN devices.
Figure 2:
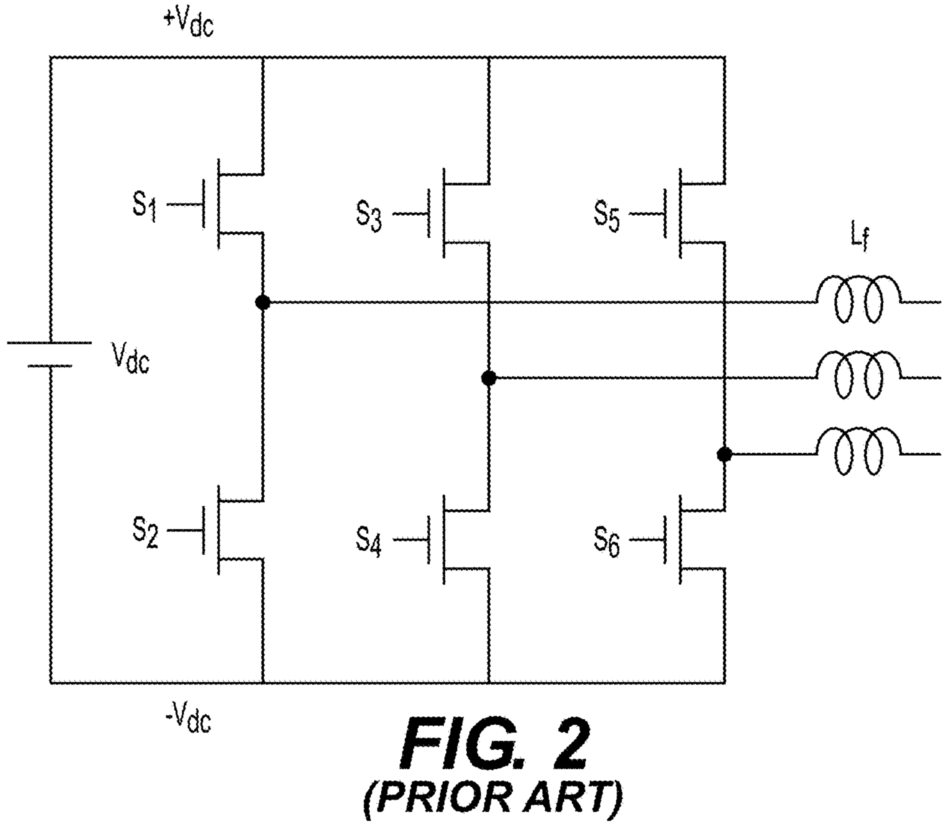
FIG. 2 is a circuit diagram of a conventional three-phase, six-switch boost converter circuit using GaN devices.
Figure 3:
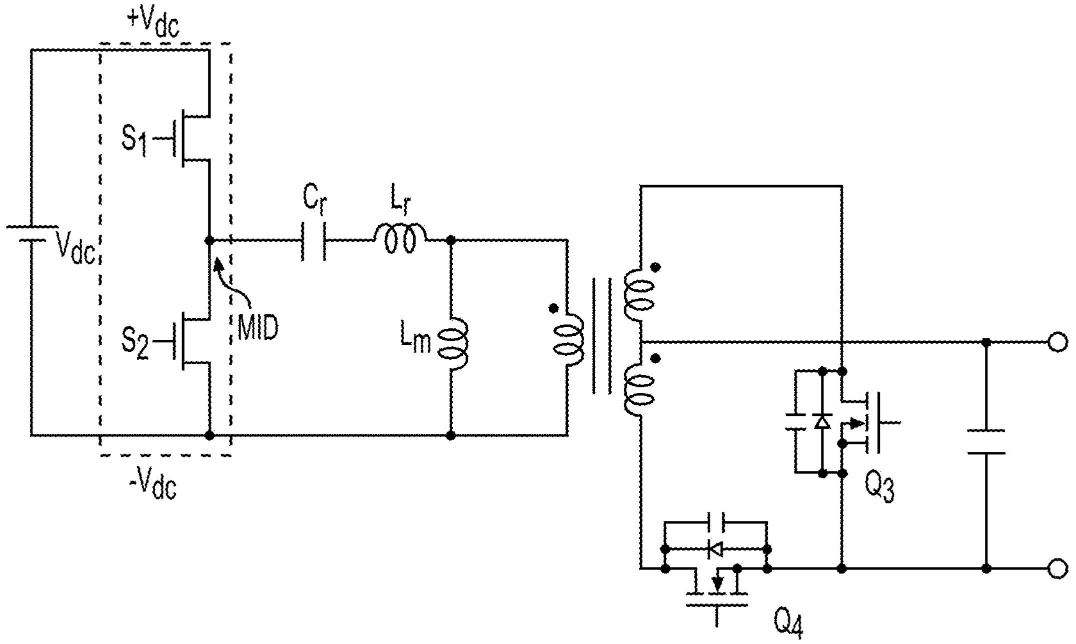
FIG. 3 is a circuit diagram of a conventional half-bridge LLC converter circuit using GaN devices.
Figure 4:
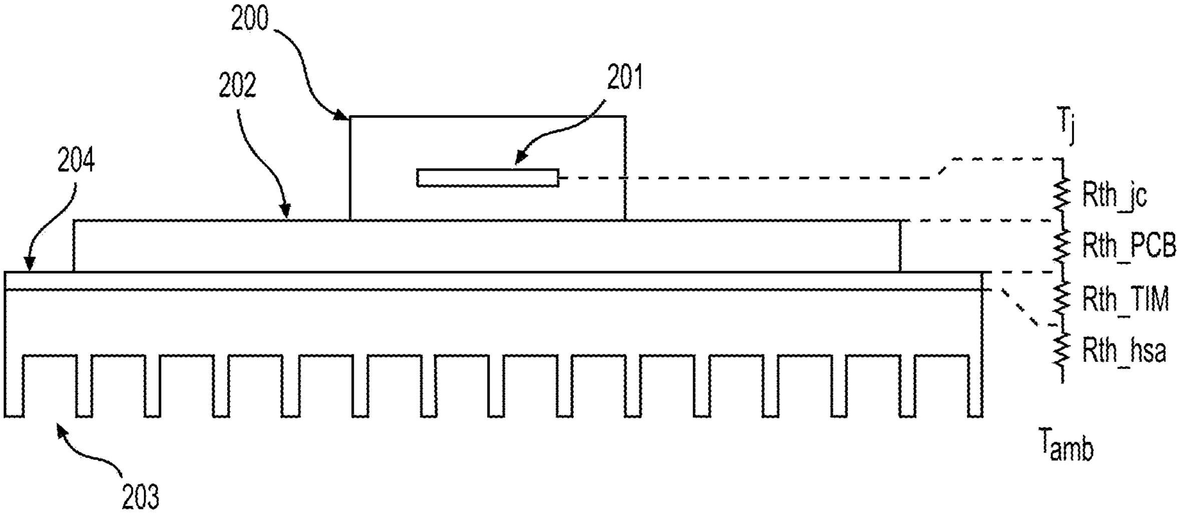
FIG. 4 shows a conventional GaN circuit assembly.
Figure 5:
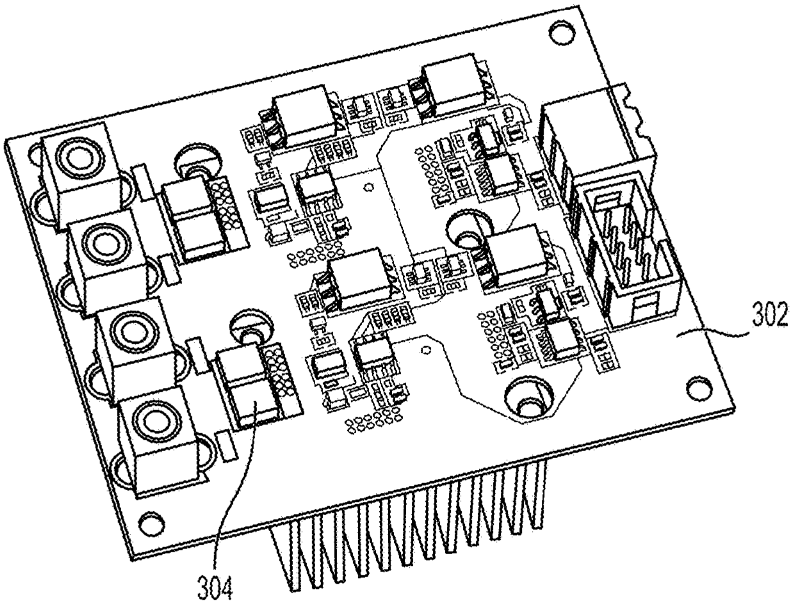
FIGS. 5 and 6 show a conventional GaN circuit assembly using an Insulated Metal Substrate.
Figure 6:
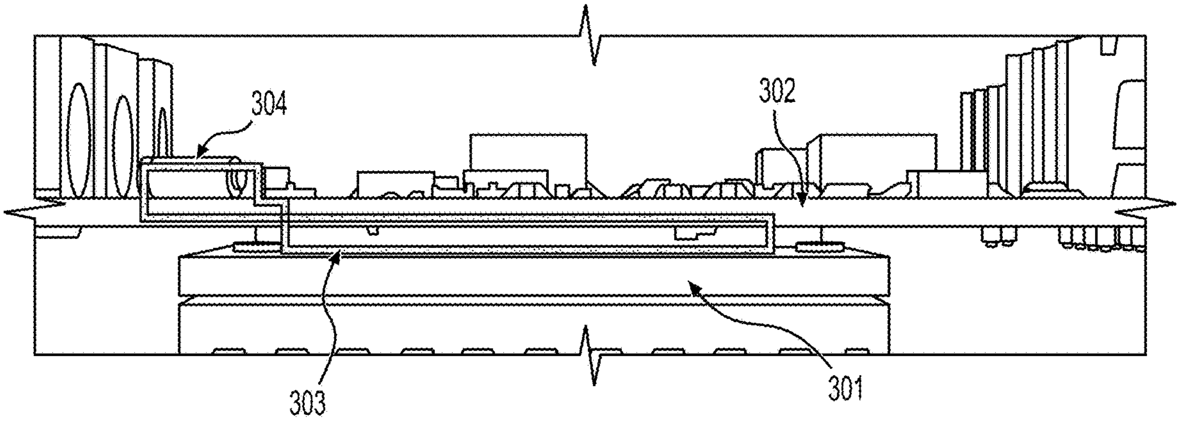
Figure 7:
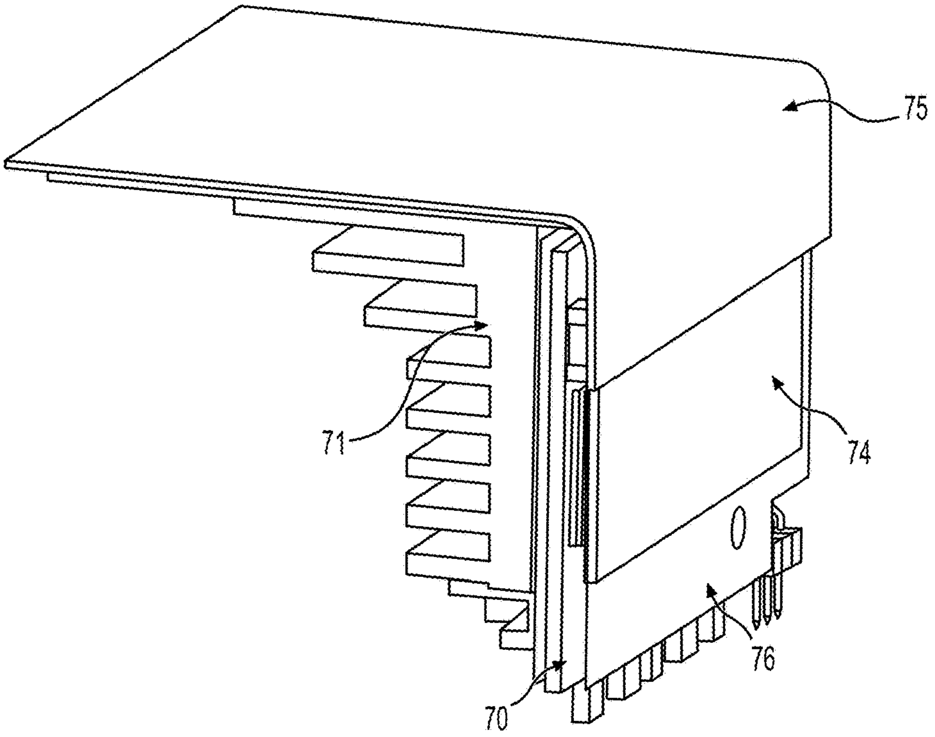
FIGS. 7 and 8 show a circuit assembly with double-sided cooling of a PCB.
Figure 8:
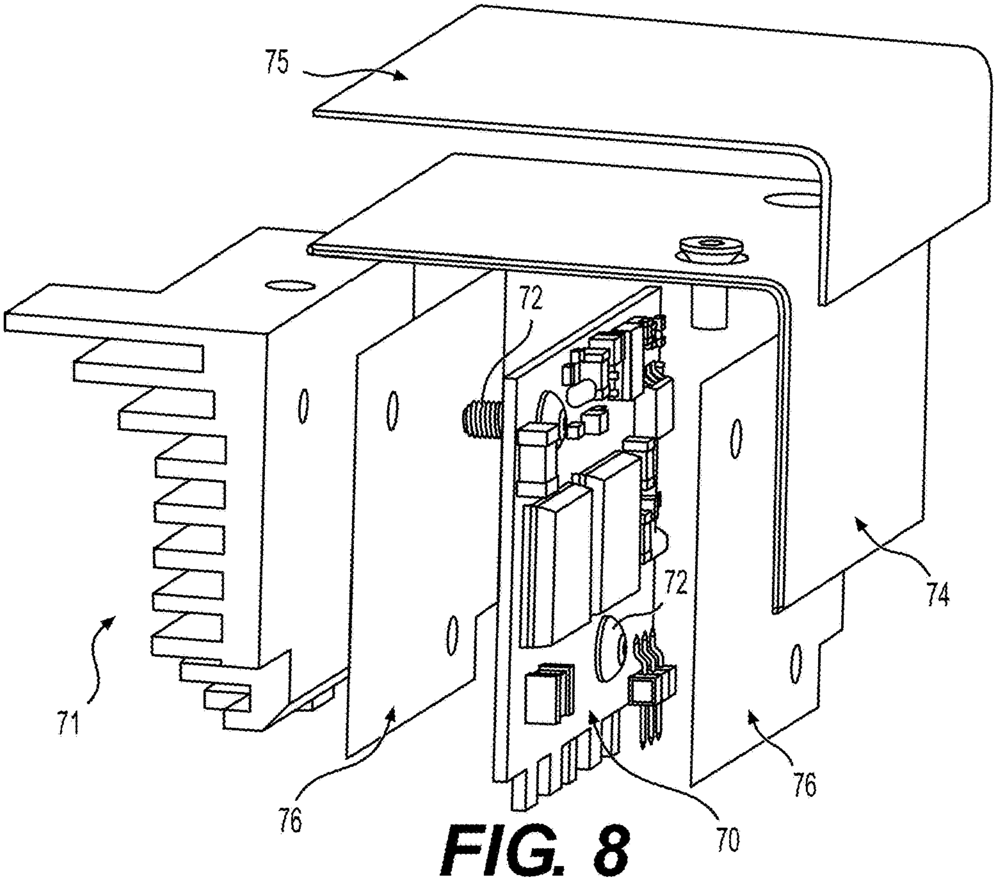

FIGS. 7 and 8 show that a PCB 70 can be used with double-sided cooling in a circuit assembly. As shown in FIGS. 7 and 8, a heatsink 71 can be attached to the PCB 70 with switch devices (which can be referred to as the switching-device PCB or the first PCB) via mounting screws 72 to extract heat from the bottom side of the switching-device PCB 70. Instead of mounting screws 72, the heatsink 71 can be attached to the switching-device PCB 70 with any suitable fastener. As shown in FIGS. 7 and 8, an L-shaped copper plate 74 can be attached to the top surface of switching devices, which can be, for example, GaN devices, on the switching-device PCB 70 for top side cooling. The L-shaped copper plate 74 can be attached to the Heatsink using screws or any other suitable fastener. Although copper is preferred, the L-shaped copper plate 74 can be made of aluminum, an alloy, or any suitable material. A TIM 76 can be used for both top and bottom contact surfaces of the L-shaped copper plate 74 and the heatsink 71, respectively, to improve thermal conduction and provide electrical insulation and clearance to other electrical components. The L-shaped copper plate 74 can also be attached to the top of the heatsink 71 by a mounting screw 72. The L-shaped copper plate 74 can have a bend angle slightly less than 90° to create adequate mechanical force on top of the switching devices on the switching-device PCB 70 to ensure a good thermal contact. A thermal pad 75 can be placed on the outer surface of the L-shaped copper plate 74 at an interface between the circuit assembly and a chassis of the power supply circuitry such that heat can transfer to the chassis. As such, thermal management can be more effective with the combination of different cooling methods, including force convection, conduction, and radiation.

Figure 9:
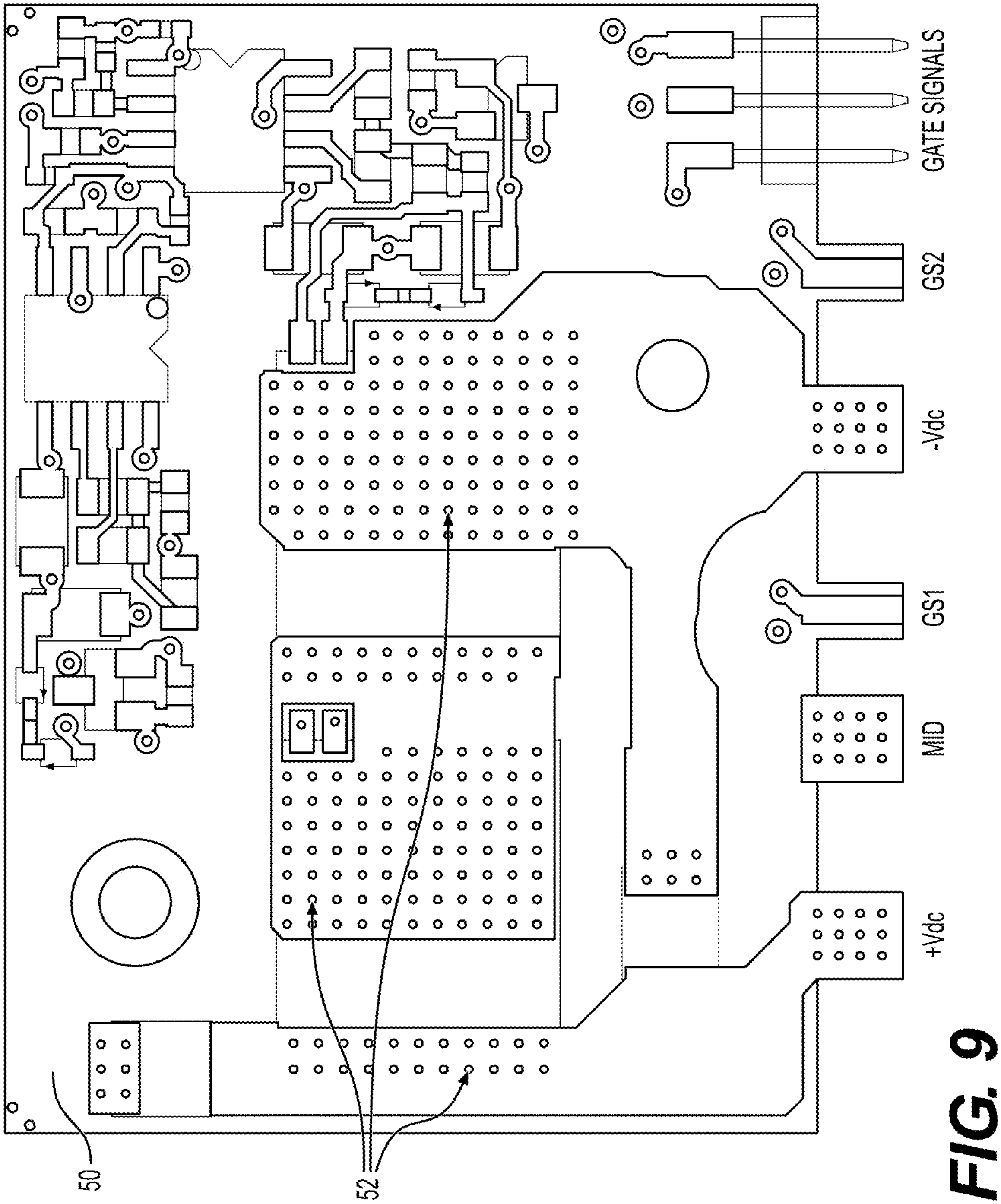
FIG. 9 shows a PCB layout design of a circuit assembly.

The cooling of the switching-device PCB 70 improves the overall thermal performance of the circuit assembly. Therefore, the thermal resistance of the switching-device PCB 70 needs to be reduced as small as possible to have the greatest effect on cooling. Similar to the copper-filled vias 52 shown in FIG. 9, copper filled vias can be used in the PCB layout design that can significantly reduce the thermal resistance of the switching-device PCB 70. Reducing or minimizing the thickness of the PCB 70 can also help reduce the thermal resistance. A thickness of about 1 mm has been found to provide an acceptable balance between the thermal resistance and rigidness of the PCB 70. In this preferred embodiment of the present invention, the gate drive circuit of the circuit assembly is also integrated in the PCB 70 to reduce or minimize any looping of the gate driver signals GS1 and GS2.

Figure 10:
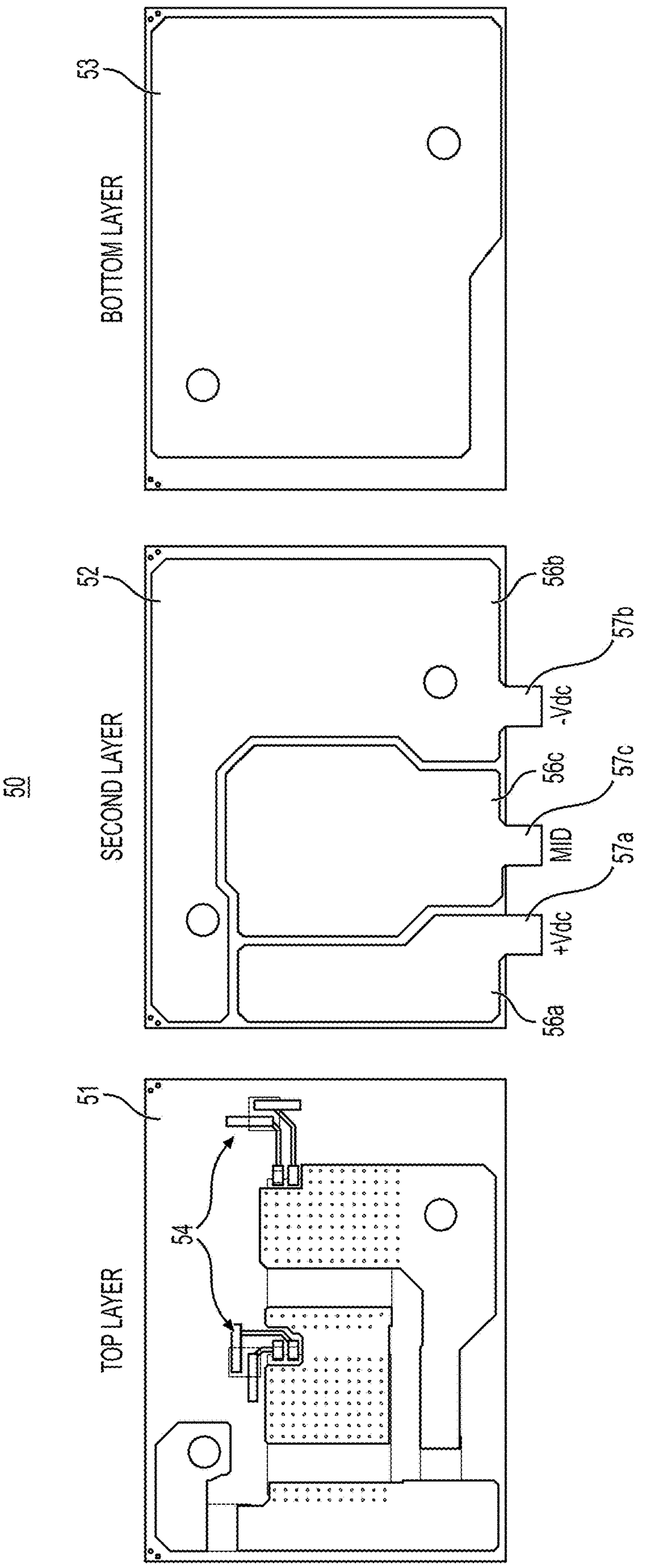
FIG. 10 shows an inlay PCB according to a preferred embodiment of the present invention.

The inlay PCB 50 shown in FIG. 10 has top, second, and bottom layers 51, 52, 53 with a copper inlay with a thickness of, for example, about 1 mm-2 mm within manufacturing tolerances included in the second or middle layer. The copper inlay can have standard thicknesses of about 1.0 mm, about 1.5 mm, or about 2.0 mm, within manufacturing tolerances, or can have another suitable thickness. The copper inlay can be heavy ounce copper, including, e.g., 6-ounce or 10-ounce copper. As shown in FIG. 10, the top layer 51 can include pads or connectors 54 to connect to a gate-driver PCB (not shown in FIG. 10). In the second layer 52, the copper inlay is divided into three copper planes 56*a*, 56*b*, 56*c* connecting to the power connections +Vdc, −Vdc, and MID, respectively. Tabs 57*a*, 57*b*, 57*c* for each of these three copper planes 56*a*, 56*b*, 56*c* can extend outside the perimeter of the rectangular shape of the inlay PCB 50 to provide power connections to the main board (not shown). The copper planes 56*a*, 56*b*, 56*c* can be connected to the switching devices in the top layer through microvias, similar to the microvias 61 shown in FIGS. 11A and 11B. The microvias can be copper filed vias to provide better thermal conduction. The holes in the top, second, and bottom layer 51, 52, 53 can be included to mount a heatsink (not shown in FIG. 10) to the to the inlay PCB 50. The copper plane 56*b* connected to the power connection −Vdc can extend along the bottom layer to help reduce or minimize stray inductance of the power loop. In addition, the bottom layer 53 with the copper plane 56*b* connected to the power connection −Vdc can be attached to a heatsink without a TIM layer because the heatsink can be connected to the bottom layer 53, significantly reducing or minimizing the thermal resistance between inlay PCB 50 and the heatsink.

Figure 11A:
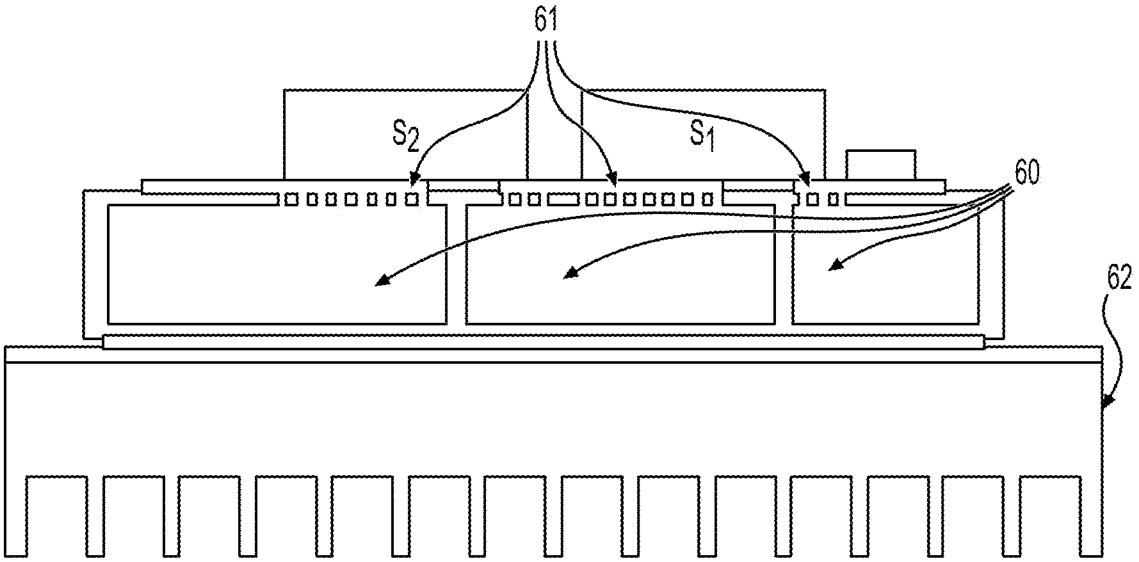
FIGS. 11A and 11B are cross-sections of an inlay PCB according to preferred embodiments of the present invention.
Figure 11B:
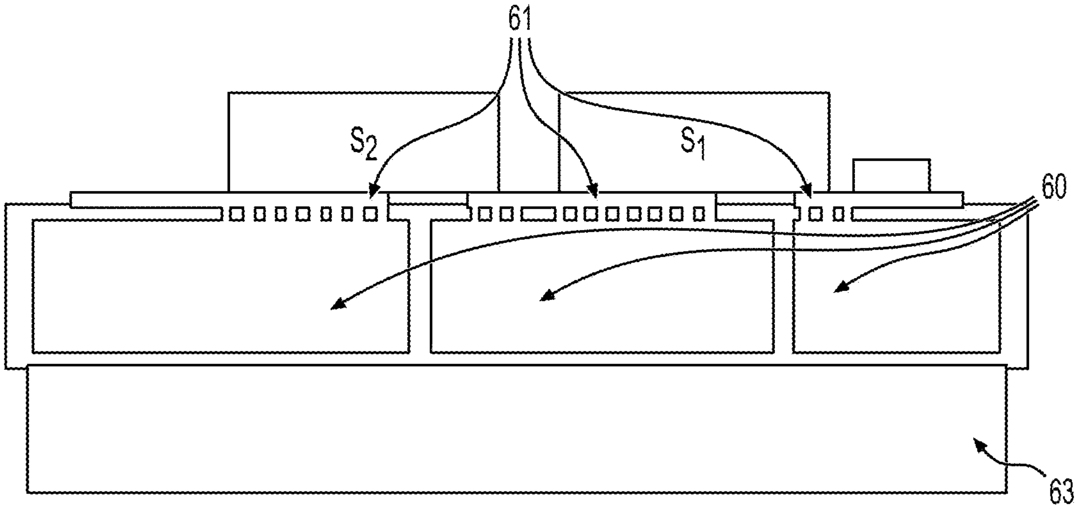

FIG. 11A shows an example of a circuit assembly that includes an inlay PCB 60 with a copper inlay that is thermally connected by the microvias 61 to the switching devices S1 and S2, which can be, for example, GaN switching devices, on the top surface of the inlay PCB 60. FIG. 11A shows that the inlay PCB 60 can be attached to a heatsink 62. FIG. 11B shows that the inlay PCB 60 can alternatively include an metal substrate 63 rather than a heatsink. The metal substrate 63 can be a copper substrate or can be any other suitable metal or alloy. Alternatively, the metal substrate 63 can also be an integrated IMS. A thermal path can be provided between the switching devices S1 and S2 to the metal substrate 63 via the microvias 61 and either heavy copper planes or copper inlays of the inlay PCB 60.

Due to the relatively large surface area of the copper inlays in the inlay PCB 60, the copper inlays can effectively transfer and spread the heat away from switching devices S1 and S2. Therefore, with an inlay PCB 60, the thermal resistance of the inlay PCB 60 can be significantly reduced. To achieve the best thermal performance of the inlay PCB 60, the gate driver circuit can be located on a separate board so that the layout of the copper inlay can be improved or optimized. FIG. 10 shows that the gate driver circuit shown in FIG. 9 has been removed from the inlay PCB. Instead, FIG. 10 shows locations for surface mount connectors 54 that can be used to connect the gate signals from the gate-driver PCB.

In a higher power density design, an inlay PCB 60 can be combined with a metal substrate 63 that is an IMS as discussed above with respect to FIG. 11B. In this configuration, there is a copper inlay in the second layer and a copper substrate in the bottom layer. No separate heatsink is required because the metal substrate 63 functions as a heatsink. Configured with these preferred embodiments of the present invention, a circuit assembly can have a very high power density and can be made simpler.

Figure 12:
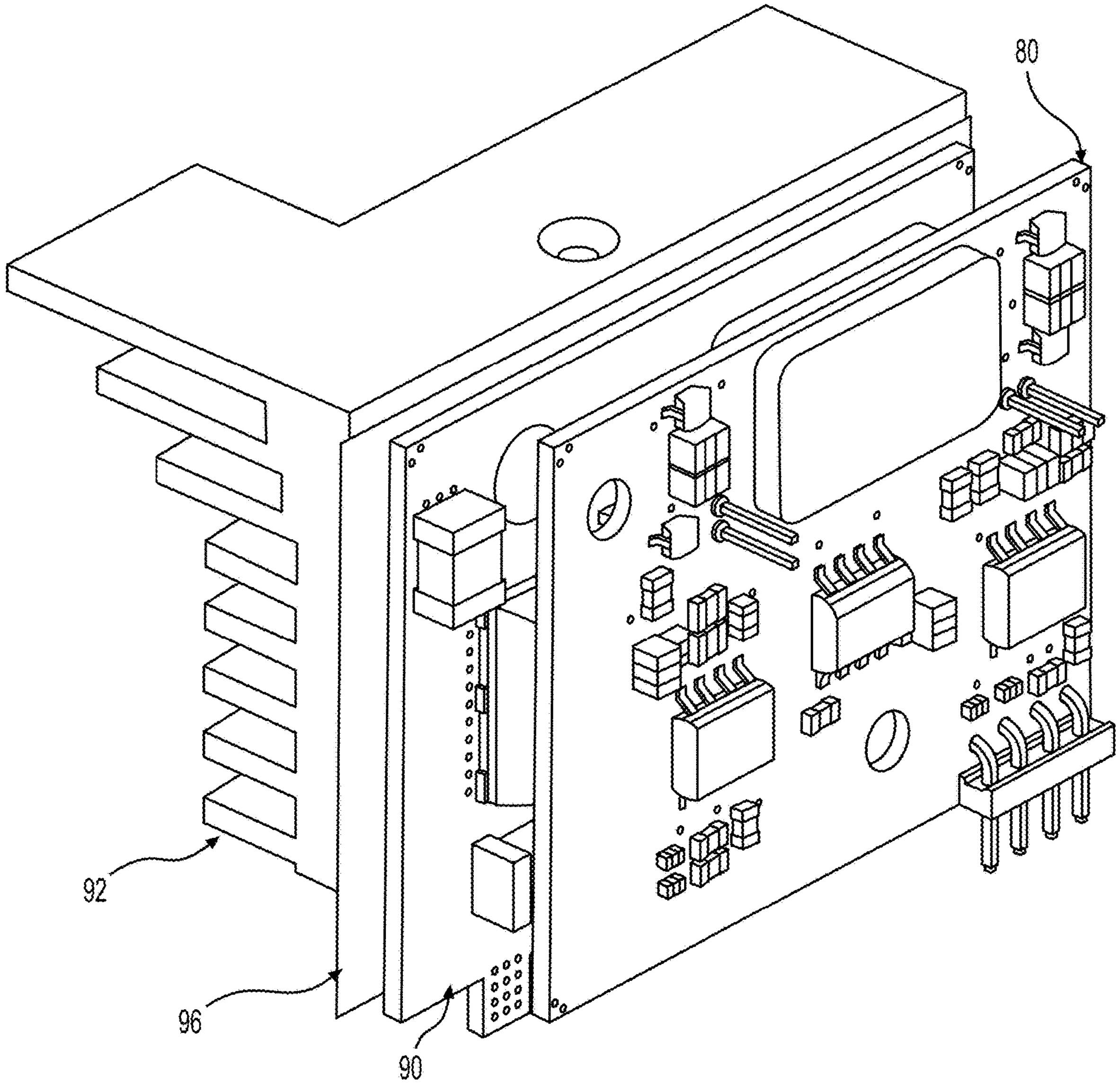
FIGS. 12 and 13 show a circuit assembly with separate switching-device PCB and gate-driver PCB.
Figure 13:
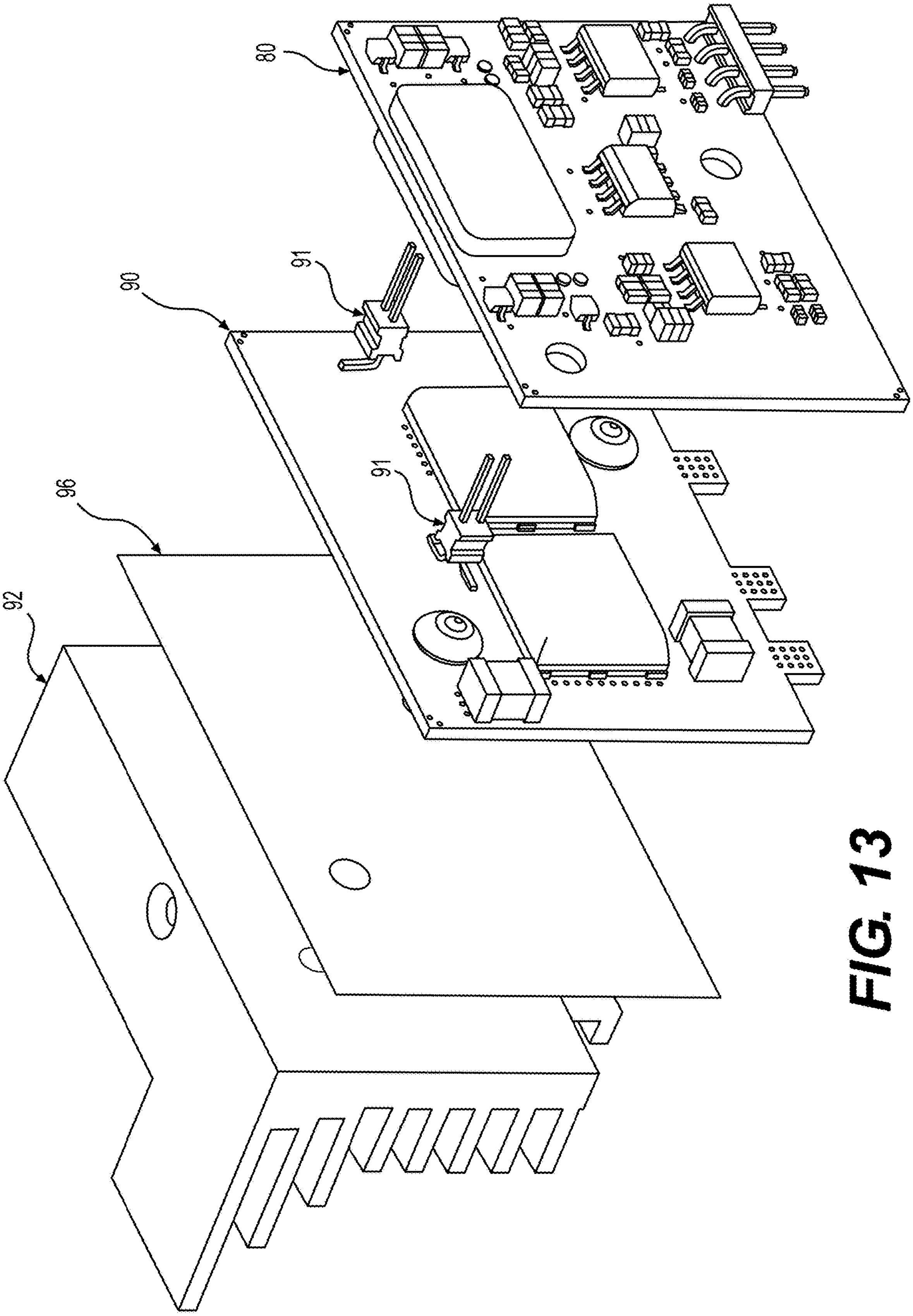

FIGS. 12 and 13 show another preferred embodiment of the present invention in which gate driver circuitry can be integrated into a gate driver PCB 80 and separated from the switching-device PCB 90 that includes the switching devices. As shown in FIGS. 12 and 13, the switching-device PCB 90 (either a standard or an inlay PCB) is attached to the heatsink 92. If a standard PCB is used as the switching-device PCB 90, a TIM layer 96 is required between the switching-device PCB 90 and the heatsink 92 to provide electrical isolation. The TIM 96 may be not required if an inlay PCB is used as the switching-device PCB 90 because the bottom layer of inlay PCB can be made with a dielectric material that can provide isolation. If a TIM 96 is not used, then the thermal resistance of the TIM 96 can be eliminated. If needed, a thermal grease or phase-change thermal material with very high thermal conductivity can be used to remove the air voids between the switching-device PCB 90 and the heatsink 92.

As shown in FIG. 13, surface mount connectors 91 can be used to transfer electrical signals between the switching-device PCB 90 and the gate driver PCB 80, although other connection mechanisms are possible.

Figure 14:
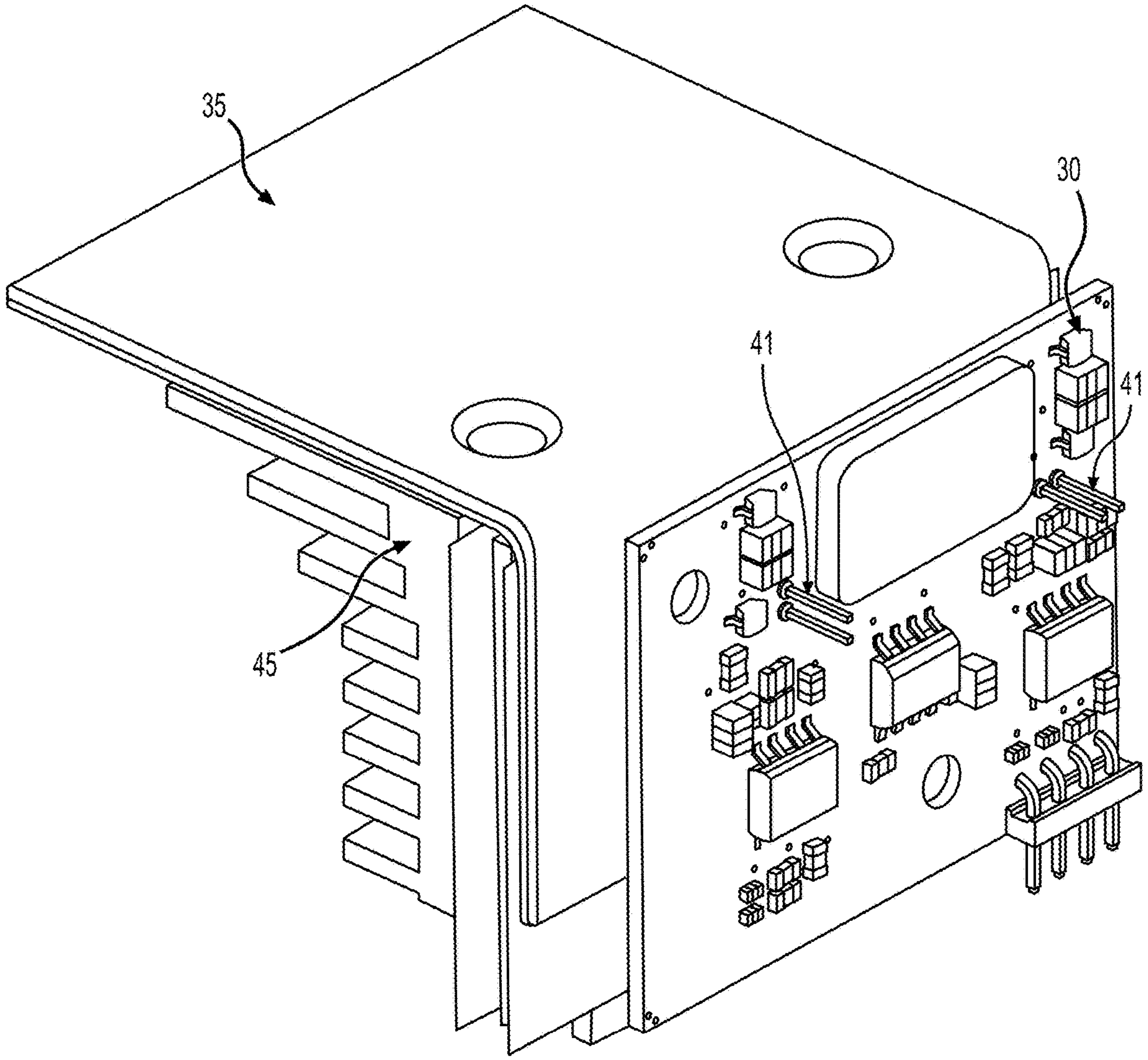
FIGS. 14-16 show a circuit assembly with separate switching-device PCB and gate-driver PCB.
Figure 15:
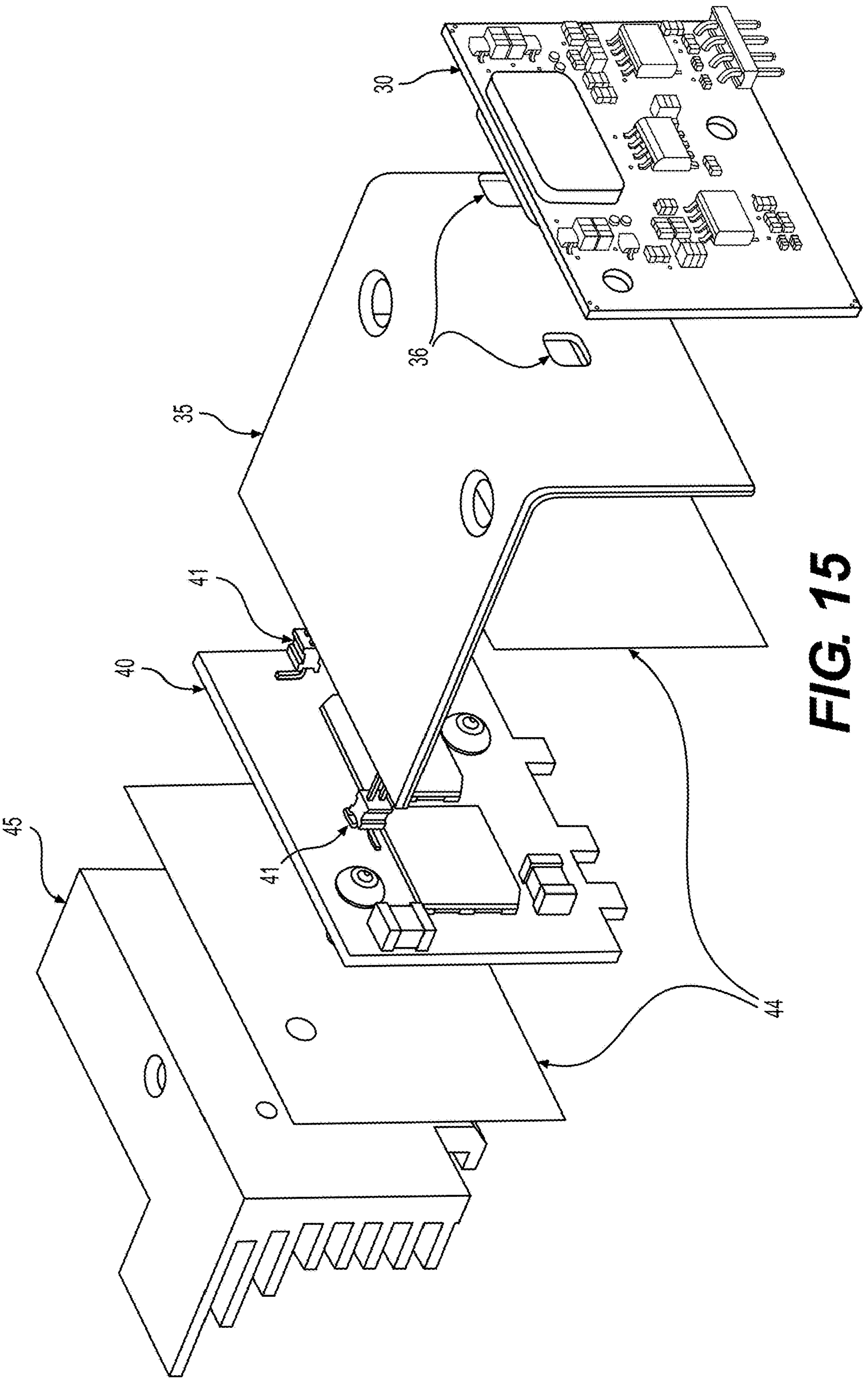
Figure 16:
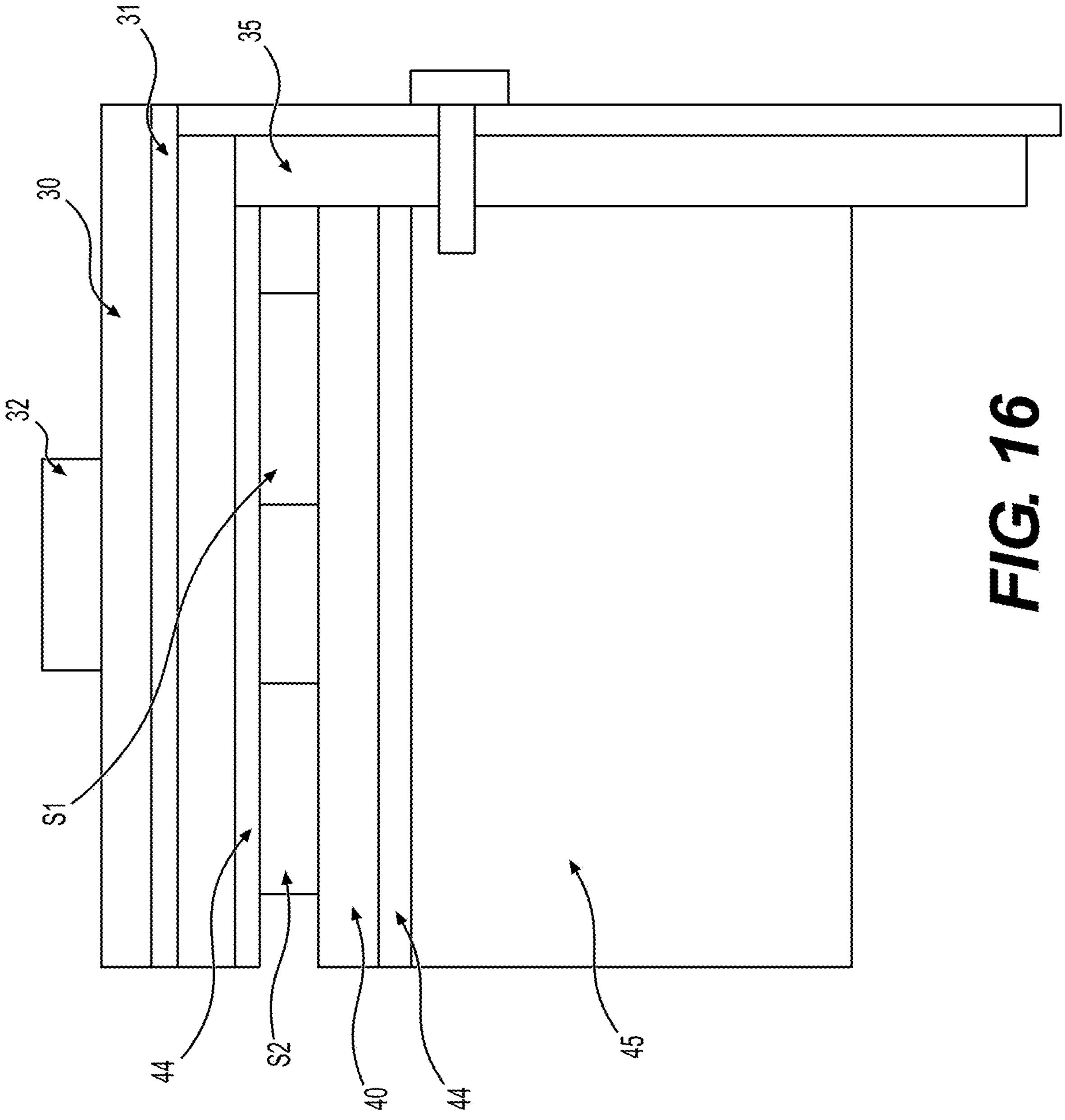

FIGS. 14-16 show another preferred embodiment of the present invention in which gate driver circuitry 32 can be integrated into a gate driver PCB 30 and separated from the switching-device PCB 40 that includes the switching devices. As shown in FIGS. 14 and 15, the switching-device PCB 40 is attached to the heatsink 45. A TIM layer 44 can be used between the switching-device PCB 40 and the heatsink 45 to provide electrical isolation. If needed, a thermal grease or phase-change thermal material with very high thermal conductivity can be used to remove the air voids between the switching-device PCB 40 and the heatsink 45.

As shown in FIG. 15, surface-mount connectors 41 can be used to transfer electrical signals between the switching-device PCB 40 and the gate driver PCB 30, although other connection mechanisms are possible.

As shown in FIGS. 14-16, an L-shaped plate 35 can be added to provide additional top side cooling to further improve the thermal performance. Although the L-shaped plate 35 can include copper, the L-shaped plate 35 can include aluminum, an alloy, or any other suitable material. As shown, the L-shaped plate 35 can include two cutouts 36 through which the surface-mount connectors 41 extend from the switching-device PCB 40 to the gate driver PCB 30 to connect to the gates of the switching devices. FIG. 15 shows that TIM layers 44 can be used between the heatsink 45 and the switching-device PCB 40 and between the switching-device PCB 40 and the L-shaped plate 35 to provide electrical isolation. As shown in FIG. 16, a thermal pad 31 can be placed on the outer surface of the L-shaped plate 35 at an interface between the L-shaped plate 35 and a chassis of the power supply circuitry such that heat can transfer to the chassis. As such, thermal management can be more effective with the combination of different cooling methods, including force convection, conduction, and radiation. The thermal pad 31 can extend along the L-shaped plate 35 at an interface between the L-shaped plate 35 and the gate driver PCB 30.

Figure 17:
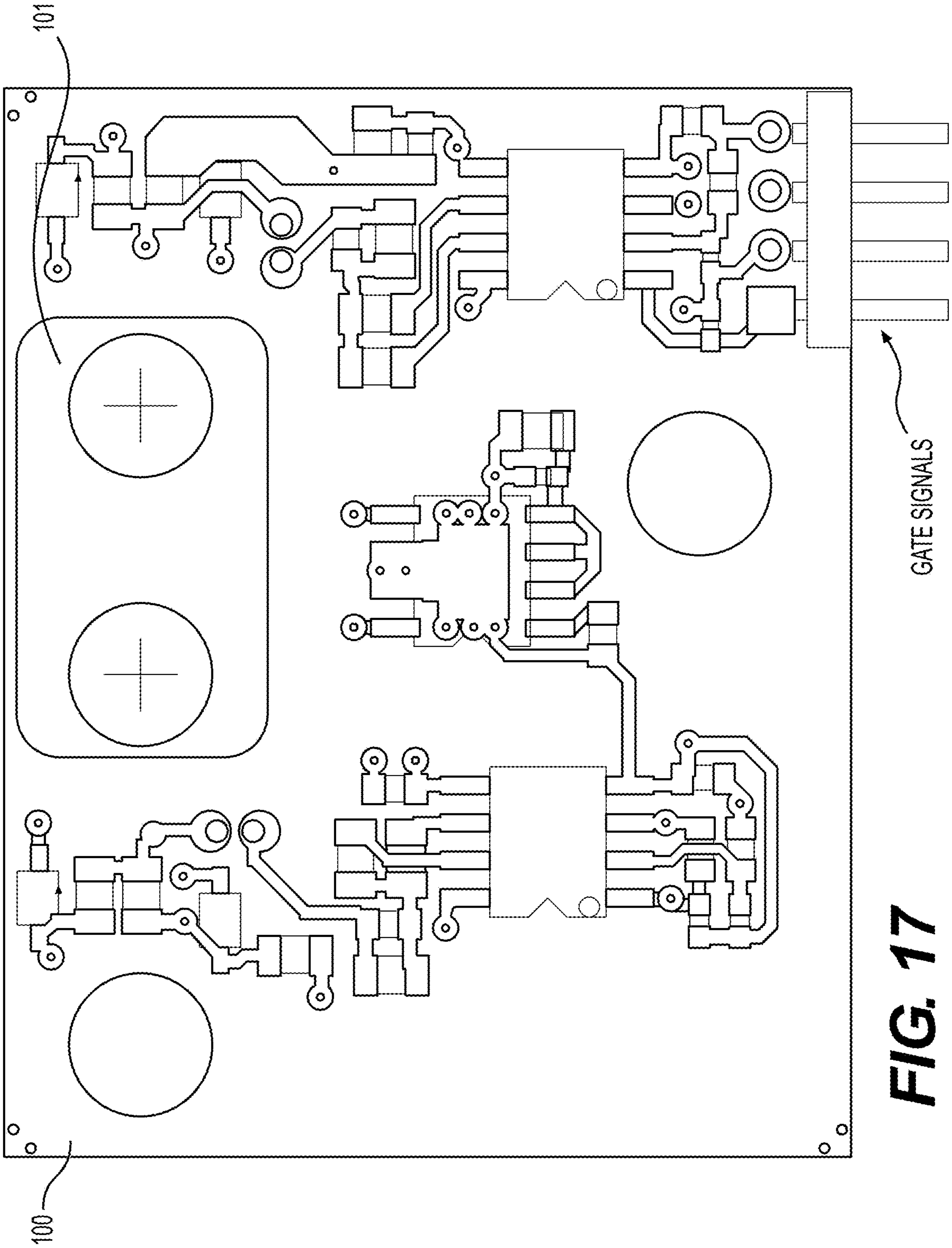
FIG. 17 shows a gate-driver PCB with an isolated pulse transformer.

In another preferred embodiment of the present invention, FIG. 17 shows that an isolated pulse transformer 101 can be integrated in the gate driver PCB 100. The gate driver PCB 100 as shown in FIG. 17 can include an integrated isolated pulse transformer 101 that provides a two-channel isolated power supply to the gate drivers of the respective switching devices. Windings of the isolated pulse transformer 101 are defined by traces in the PCB. Therefore, the isolated pulse transformer 101 has a low profile and can be easily made.

The winding arrangement has very low inter-winding capacitance, a low leakage inductance, and more than 1500 V isolation. A low capacitance is important to minimize or significantly reduce CM current injection caused by fast-switching transients, and a low leakage inductance helps with open-loop output voltage regulation. A power supply that includes the GaN assembly can include both +7.5V and −2.5V rails. The negative driver voltage is important for the reliable operation of the GaN assembly. In addition, voltage regulation can be added to the negative voltage rail to ensure that the gate threshold voltages are not exceeded during transients and to reduce or minimize the reverse conduction losses.

It should be understood that the foregoing description is only illustrative of the present invention. Various alternatives and modifications can be devised by those skilled in the art without departing from the present invention. Accordingly, the present invention is intended to embrace all such alternatives, modifications, and variances that fall within the scope of the appended claims.

What is claimed is:

1. A circuit assembly comprising:

a first printed circuit board (PCB);

a switching device located on a first side of the first PCB;

a first thermal interface material (TIM) in contact with the switching device;

a heatsink attached to a second side surface of the first PCB opposite to the first side; and an L-shaped metal plate including a first portion attached to the heatsink and a second portion directly attached to the first PCB through the first TIM to define a thermal path between the first and the second sides of the first PCB.

2. The circuit assembly according to claim 1, wherein the L-shaped metal plate contacts a top surface of the switching device through the first TIM.

3. The circuit assembly according to claim 1, further including a second TIM between the heatsink and the first PCB.

4. The circuit assembly according to claim 1, wherein the L-shaped metal plate includes copper.

5. The circuit assembly according to claim 1, wherein the first and the second portions of the L-shaped metal plate define a bend with an angle less than 90°.

6. The circuit assembly according to claim 1, wherein the first PCB is 1-mm thick.

7. The circuit assembly according to claim 1, wherein the first PCB includes a middle metal plane as an interior layer.

8. The circuit assembly according to claim 7, wherein
the middle metal plane includes multiple portions, and
each of the multiple portions is connected to a different circuit node on the first PCB.

9. The circuit assembly according to claim 7, wherein the middle metal plane of the first PCB is connected to the switching device through microvias in the first PCB.

10. The circuit assembly according to claim 1, wherein the first PCB includes copper-filled microvias located beneath the switching device.

11. The circuit assembly according to claim 10, wherein
the first PCB includes a copper inlay; and
the copper-filled vias provide a thermal path between the switching device and the copper inlay.

12. The circuit assembly according to claim 1, further comprising:
a second PCB; and
driver circuitry on the second PCB that drives the switching device.

13. The circuit assembly according to claim 12, wherein the second portion of the L-shaped plate is located between the first PCB and the second PCB.

14. A circuit assembly comprising:
a first printed circuit board (PCB);
a switching device located on the first PCB;
a thermal interface material (TIM) in contact with the switching device;
a heatsink attached to the first PCB;
an L-shaped metal plate including a first portion attached to the heatsink and a second portion directly attached to the first PCB through the TIM to define a thermal path between first and second sides of the first PCB; and
a second PCB including gate driver circuitry attached to the first PCB.

15. The circuit assembly according to claim 14, further comprising a connector to route signals between the first PCB and the second PCB.

16. The circuit assembly according to claim 14, wherein the second portion of the L-shaped metal plate is located between the first PCB and the second PCB.

17. The circuit assembly according to claim 14, further comprising a transformer integrated into the second PCB.

18. The circuit assembly according to claim 14, wherein the gate driver circuitry is isolated.

19. The circuit assembly according to claim 14, wherein the switching device is a gallium nitride switching device.

20. A circuit assembly comprising:
a first printed circuit board (PCB);
a switching device located on the first PCB;
a thermal interface material (TIM) in contact with the switching device;
a heatsink attached to the first PCB;
a second PCB including gate driver circuitry attached to the first PCB; and
an L-shaped metal plate including:
a first leg located between the first PCB and the second PCB, directly attached to the first PCB through the TIM, and directly attached to the second PCB; and
a second leg attached to the heatsink.

* * * * *